(12) United States Patent
Bednorz et al.

(10) Patent No.: US 7,834,339 B2
(45) Date of Patent: Nov. 16, 2010

(54) PROGRAMMABLE-RESISTANCE MEMORY CELL

(75) Inventors: Johannes G. Bednorz, Wolfhausen (CH); Eric A. Joseph, White Plains, NY (US); Siegfried F. Karg, Adliswil (CH); Chung H. Lam, Peekskill, NY (US); Gerhard I. Meijer, Zurich (CH); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 901 days.

(21) Appl. No.: 11/612,501

(22) Filed: Dec. 19, 2006

(65) Prior Publication Data

US 2008/0142925 A1 Jun. 19, 2008

(51) Int. Cl.
*H01L 45/00* (2006.01)

(52) U.S. Cl. .............................. 257/2; 257/4; 438/900; 365/148

(58) Field of Classification Search ..................... 257/2, 257/4

See application file for complete search history.

(56) References Cited

U.S. PATENT DOCUMENTS 4,839,700 A * 6/1989 Ramesham et al. .......... 361/500

* cited by examiner

*Primary Examiner*—Jerome Jackson, Jr.
(74) *Attorney, Agent, or Firm*—Michael J. Buchenhorner; Stephen C. Kaufman

(57) ABSTRACT

The present invention relates to a memory cell comprising: a resistive structure; at least two electrodes coupled to the resistive structure, and at least one hydrogen reservoir structure, wherein the application of an electrical signal to one of the at least two electrodes causes the electrical resistance of the resistive structure to be modified by altering a hydrogen-ion concentration in the resistive structure.

20 Claims, 3 Drawing Sheets

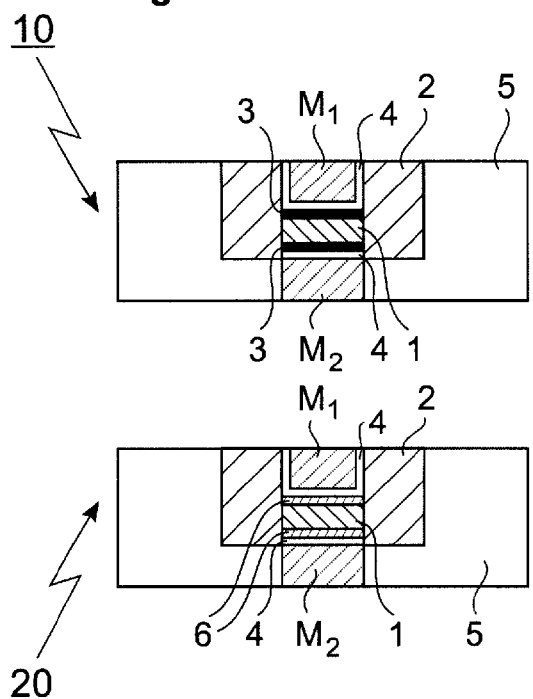
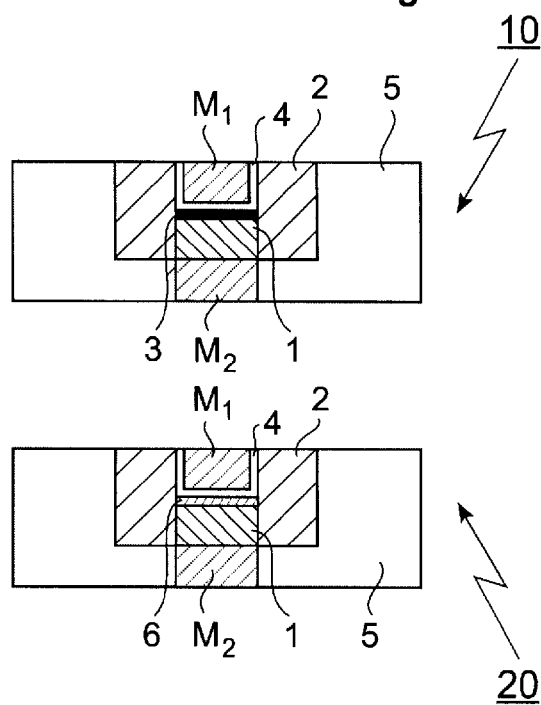
Fig. 1A
Fig. 1B
Fig. 2A
Fig. 2B

PROGRAMMABLE-RESISTANCE MEMORY CELL

FIELD OF THE INVENTION

The present invention relates to a programmable resistance memory cell, a method of fabrication therefor and a non-volatile memory device incorporating such a memory cell.

BACKGROUND OF THE INVENTION

For memory devices and for numerous other applications, bi-stable devices or circuits are used. For example, for storing one bit of information in a memory, a bi-stable device can be used which is switchable between at least two different and persistent states. When writing a logical "1" into the device, it is driven into one of the two persistent states and when writing a logical "0", or erasing the logical "1", the device is driven into the other of the two different states. Each of the states persists until a next step of writing information into the device or erasing information in the device proceeds.

Flash erasable programmable read only memory (FEPROM, also referred to as flash memory) is used in semiconductor devices and provides for rapid block erase operations. Typically, flash memory only uses one transistor per memory cell versus the two transistors per memory cell for known electrically erasable programmable read only memory (EEPROM). Thus, flash memory takes up less space on a semiconductor device and is less expensive to produce than EEPROM. Nevertheless, the development of further space-saving components of semiconductor devices and cost-efficient fabrication techniques for producing such devices continues.

To that end, the use of materials with bi-stable electrical resistance for semiconductor device applications has been studied. The resistance states of the material can be changed reversibly by applying appropriate electrical signals to the material. These electrical signals should be larger than a given threshold $V_T$ and longer than a given time t. The resistance state of the material can be read or analysed by applying other signals which are non-destructive to the conductivity state if they are much smaller than $V_T$.

Transition-metal oxides are one class of materials that can be conditioned such that they exhibit the desired bi-stable electrical resistance. Non-volatile two-terminal memory devices based on transition-metal oxides have been disclosed. Such devices comprise at least one memory cell, which comprises the arrangement of at least two electrodes being provided in contact with a transition-metal oxide layer. Depending on the polarity of electrical pulses applied to one of the electrodes relative to the other electrode, the electrical resistance of the transition-metal oxide switches reversibly between at least two different and persistent states. An example of such a device is given in U.S. Pat. No. 6,815,744.

The conditioning process that the transition-metal oxides are subjected to in order that the switching between the resistance states may be done comprises subjecting the transition-metal oxide to an appropriate electrical signal for a sufficient period of time, this being done via electrical signals applied to the electrodes contacting the transition-metal oxide layer as discussed above. The conditioning process generates a confined conductive region in the transition-metal oxide that can be reversibly switched between two or more resistance states.

Drawbacks of the above-described devices are associated with the conditioning process. This is because, not only is the conditioning process time-consuming, it is required per cell incorporated in such a device. Furthermore, the confined conductive region that is generated by the conditioning process occurs at an arbitrary position in the dielectric material, i.e., the position of the conducting path is not controllable by well-defined process parameters. This may cause a large variation in the electrical properties of such devices, that are otherwise nominally identical, to be observed. In combination, these issues pose severe drawbacks for the use of memory cells based on transition-metal oxides in a production-type array.

Accordingly, it is desirable to provide a programmable resistance memory cell that mitigates and/or obviates the drawbacks associated to known programmable resistance memory cells.

SUMMARY OF THE INVENTION

According to an embodiment of a first aspect of the present invention, there is provided a memory cell comprising: a resistive structure; at least two electrodes coupled to the resistive structure, and at least one hydrogen reservoir structure, wherein the application of an electrical signal to one of the at least two electrodes causes the electrical resistance of the resistive structure to be modified by altering a hydrogen-ion concentration in the resistive structure.

In order to initiate a conditioning process so that a confined conductive region is formed in the resistive structure, an electrical signal, such as, for example, an electrical pulse, is applied to one of the at least two electrodes relative to the other of the two electrodes. Application of the electrical signal also causes ionization of hydrogen that has migrated from the hydrogen reservoir structure and into the resistive structure. The mobility of the hydrogen ions contributes to the conditioning process being accelerated and the electrochemical reactions associated with the conditioning process being of reduced duration compared to previously-proposed devices. Not only is the time taken for the conditioning process reduced, but also some of the non-uniformities associated therewith are reduced. Thus, memory cells having a lower statistical spread of operating characteristics and being of increased reliability than previously-proposed memory cells may be produced.

Preferably, at least one of the electrodes and/or the resistive structure is at least partially embedded in the hydrogen reservoir structure. In this way, the area over which migration of the hydrogen from the hydrogen reservoir structure into the resistive structure is increased. Hence, this feature may contribute to further accelerating the conditioning process.

Desirably, the hydrogen reservoir structure is provided integrally to at least one of the electrodes. The present feature gives the advantage that the number of fabrication steps of producing an embodiment of the present invention may be reduced. Since the hydrogen reservoir structure is provided integrally to at least one of the electrodes rather than in the dielectric material that is typically formed around the memory cell, such as, for example, silicon dioxide, a memory cell according to an embodiment of the present invention also gives the advantage of volume efficiency when implemented in an array of memory cells since the space between adjacent memory cells is not taken up by the hydrogen reservoir structure, so allowing denser packing of the memory cells.

Preferably, at least one of the electrodes is permeable to hydrogen. This feature aids the migration of hydrogen from the hydrogen reservoir structure into the resistive structure where it contributes to accelerating the conditioning process.

Desirably, at least one of the electrodes comprises a coupling layer for coupling the electrode to the resistive structure, the coupling layer comprising a material that absorbs at least 0.1 weight-percent of hydrogen. Since the material of the coupling layer is selected to absorb and/or have an affinity for hydrogen, the probability of the hydrogen migrating from the hydrogen reservoir structure being drawn into the resistive structure, where it contributes to accelerating the conditioning process, is increased. In this regard, it is preferable that the material of the coupling layer comprises one of: palladium (Pd), iridium (Ir), rhodium (Rd), a hydride and an alloy comprising hydrogen. In this regard and for the sake of example, the hydride may comprise one of yttrium hydride ($YH_2$) and lanthamum hydride ($LaH_2$) and the alloy may comprise one of magnesium nickel hydride ($Mg_2NiH_4$) and lanthamum nickel hydride ($LaNi_5H_6$).

Desirably, the hydrogen reservoir structure comprises a first dielectric material. This feature provides the advantage that, by being made up of non-conducting material, the presence of the hydrogen reservoir structure does not interfere with the conductive region formed in the resistive structure during the conditioning process.

Preferably, the first dielectric material comprises one of: ozone tetraethoxysilane (TEOS), a transition-metal oxide, a metal hydroxide and a zeolite. In this regard and for the sake of example, the transition-metal oxide may be hydrogen tungsten oxide ($H—WO_3$), the metal hydroxide may be one of aluminium hydroxide ($Al(OH)_3$), strontium hydroxide ($Sr(OH)_2$) and calcium hydroxide ($Ca(OH)_2$) and the zeolite may be hydrogen silicon oxide ($H_2Si_2O_5$).

Preferably, the resistive structure comprises a transition-metal oxide. The ionic mobility of hydrogen provides increased conductivity in the conductive region formed in the transition-metal oxide material and so contributes to accelerating the conditioning process.

According to an embodiment of a second aspect of the present invention, there is provided a non-volatile memory device comprising at least one memory cell according to an embodiment of the first aspect of the present invention. As discussed above, in an embodiment of the first aspect of the present invention, not only is the time taken for the conditioning process reduced, but also some of the non-uniformities associated with the conditioning process are reduced. Thus, memory cells having a lower statistical spread of operating characteristics and being of increased reliability than previously-proposed memory cells may be produced. Such properties are also displayed by a non-volatile memory device incorporating a memory cell according to an embodiment of the first aspect of the present invention.

Preferably, in an embodiment of the second aspect of the present invention, the hydrogen reservoir structure is provided so as to be shared by at least two memory cells. This feature provides the advantage that the number of fabrication steps is reduced as are costs associated with the fabrication in that not as much material for the hydrogen reservoir structure is used compared to if it were provided per memory cell. A further advantage of the capability of denser packing of the memory cells is also provided by this feature.

Corresponding method aspects are also provided and thus according to an embodiment of a third aspect of the present invention, there is provided a method for fabricating a memory cell comprising the steps of: providing a resistive structure; coupling at least two electrodes to the resistive structure, and providing at least one hydrogen reservoir structure.

Any of the device features may be applied to the method aspect of the invention and vice versa. Features of one aspect of the invention may be applied to another aspect of the invention. Any disclosed embodiment may be combined with one or several of the other embodiments shown and/or described. This is also possible for one or more features of the embodiments.

BRIEF DESCRIPTION OF THE DRAWINGS

Reference will now be made, by way of example, to the accompanying drawings, in which:

FIG. 1A schematically illustrates an embodiment of the present invention;

FIG. 1B schematically illustrates an alternative arrangement of the embodiment shown in FIG. 1A;

FIG. 2A schematically illustrates another embodiment of the present invention;

FIG. 2B schematically illustrates an alternative arrangement of the embodiment shown in FIG. 2A;

DESCRIPTION OF THE PREFERRED EMBODIMENTS

Figure 3:
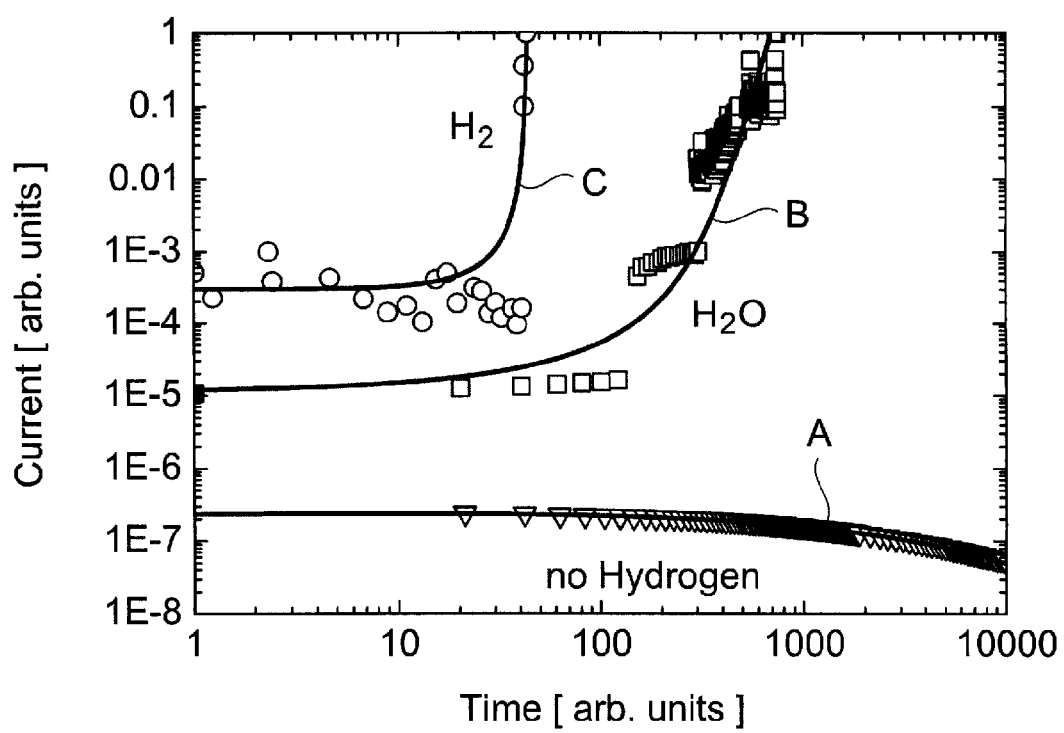
FIG. 3 shows experimental results pertaining to an embodiment of the present invention, and FIG. 4 schematically illustrates a method according to an embodiment of the present invention.

Within the description, the same reference numerals or signs are used to denote the same parts or the like.

FIG. 1A schematically illustrates a memory cell 10 according to an embodiment of the present invention. The memory cell 10 comprises a resistive structure 1. The resistive structure 1 is provided between at least two electrodes M1, M2. The material of the resistive structure 1 is chosen so that the resistive structure 1 exhibits at least two stable resistance states, it being possible to switch the electrical resistance of the resistive structure 1 between the exhibited resistance states by the application of an electrical signal to one of the electrodes M1, M2 relative to the other of the electrodes M1, M2. The memory cell 10 also comprises at least one hydrogen reservoir structure 2.

Although an embodiment of the present invention will be described hereinafter with reference to the resistive structure 1 being made of a transition-metal oxide, the present invention is not limited thereto and resistive structure 1 may be selected to comprise any other appropriate material.

In order to initiate a conditioning process so that a confined conductive region is formed in the transition-metal oxide, an electrical signal, such as, for example, an electrical pulse, is applied to one of the at least two electrodes M1, M2 relative to the other of the two electrodes M1, M2. Application of the electrical signal also causes ionization of hydrogen that has migrated from the hydrogen reservoir structure 2 and into the transition-metal oxide of the resistive structure 1. The mobility of the hydrogen ions contributes to the conditioning process being accelerated and the electrochemical reactions associated with the conditioning process being of reduced duration compared to previously-proposed devices. Not only is the time taken for the conditioning process reduced, but also some of the non-uniformities associated therewith are reduced. Thus, memory cells having a lower statistical spread of operating characteristics and being of increased reliability than previously-proposed memory cells may be produced. Hence, the electrical resistance of a memory cell 10 according to an embodiment of the present invention can be switched faster than is the case for previously-proposed devices.

In an embodiment of the present invention, the hydrogen reservoir structure 2 comprises a dielectric material, hereinafter referred to as a first dielectric material, which is selected to comprise one of: ozone tetraethoxysilane (TEOS), a transition-metal oxide, a metal hydroxide and a zeolite. In this regard and for the sake of example, the transition-metal oxide may be hydrogen tungsten oxide (H—WO3), the metal hydroxide may be one of aluminium hydroxide ($Al(OH)_3$), strontium hydroxide ($Sr(OH)_2$) and calcium hydroxide ($Ca(OH)_2$) and the zeolite may be hydrogen silicon oxide ($H_2Si_2O_5$).

In an embodiment of the present invention, at least one of the electrodes M1, M2 and/or the resistive structure 1 is at least partially embedded in the hydrogen reservoir structure 2. Thus, the area over which migration of the hydrogen from the hydrogen reservoir structure 2 into the transition-metal oxide is increased. Hence, this feature may contribute to further accelerating the conditioning process. Alternatively, the hydrogen reservoir structure 2 is provided integrally to at least one of the electrodes M1, M2 rather than in the dielectric material 5, that is typically formed around the memory cell 10 and which is, for example, silicon dioxide. This may be done by using a material comprising hydrogen for the electrode M1, M2, for example, a metal that stores hydrogen. It may also be done by incorporating particles of a material comprising hydrogen into the electrode M1, M2, for example, by embedding the particles in the electrode M1, M2. An embodiment of the present invention is, of course, not limited to providing the above-described specific arrangements of the hydrogen reservoir structure 2 in isolation and they may be provided in combination with each other. In fact, the scope of the present invention extends to any arrangement of the hydrogen reservoir structure 2 that accommodates the migration of hydrogen into the resistive structure 1.

As can be seen from FIG. 1A, the electrodes M1, M2 of the memory cell 10 include a metallization layer 3 made of platinum, for example, for coupling to the resistive structure 1. For improved contact with the metallization layer 3, an adhesion layer 4 may be coated on the surface(s) of the electrodes M1, M2. In this regard, the metallization layer 3 may also be provided with the adhesion layer 4. The material of the adhesion layer 4 may be titanium (Ti), titanium nitride (TiN), tantamum (Ta) or tantamum nitride (TaN), for example. In order to aid the migration of hydrogen from the hydrogen reservoir structure 2 into the resistive structure 1, the electrodes M1, M2 comprise material that is permeable to and/or absorb hydrogen.

In an embodiment of the present invention, the electrodes M1, M2 are also taken to comprise at least an electrical connector, for example a via plug for connecting to a foremost layer of a CMOS layered arrangement. This arrangement is shown in FIG. 1B where the electrode M2 is depicted as the via plug.

FIG. 2A shows a memory cell 20 according to another embodiment of the present invention. In this case, the electrodes M1, M2 include a coupling layer 6, by way of which they are connected to the resistive structure 1. The material of the coupling layer 6 is selected to absorb and/or have an affinity for hydrogen. Thus, the probability of the hydrogen migrating from the hydrogen reservoir structure 2 being drawn into the resistive structure 1, where it contributes to accelerating the conditioning process, is increased. In this regard, it is preferable that the material of the coupling layer 6 absorbs at least 0.1 weight % of hydrogen. By way of example, the material of the coupling layer 6 comprises one of: palladium (Pd), iridium (Ir), rhodium (Rd), a hydride and an alloy comprising hydrogen. In this regard and for the sake of example, the hydride may comprise one of yttrium hydride ($YH_2$) and lanthamum hydride ($LaH_2$) and the alloy may comprise one of magnesium nickel hydride ($Mg_2NiH_4$) and lanthamum nickel hydride ($LaNi_5H_6$).

In an embodiment of the present invention where the hydrogen reservoir structure 2 is provided integrally to at least one of the electrodes M1, M2, this may be done by incorporating particles comprising hydrogen in the coupling layer 6. Where the material of the coupling layer 6 does not contain hydrogen, for example, where the coupling layer 6 comprises palladium, iridium or rhodium, the coupling layer 6 may be annealed in an atmosphere comprising hydrogen, thereby to incorporate the hydrogen in the coupling layer 6.

FIG. 2B depicts an alternative arrangement of the embodiment shown in FIG. 2A in that the coupling layer 6 is only provided to one of the electrodes M1, M2 and that the other of the two electrodes is a via plug for connecting to a CMOS substrate.

The present invention also extends to a non-volatile memory device comprising at least one memory cell 10, 20 according to an embodiment of the present invention and as described above. Where the non-volatile memory device comprises an array of memory cells 10, 20 according to an embodiment of the present invention, the hydrogen reservoir structure 2 is provided so as to be shared by adjacent memory cells 10, 20. This could be implemented in the array by providing the hydrogen reservoir structure 2 continuously between all of the memory cells 10, 20 or some adjacent memory cells 10, 20.

FIG. 3 shows experimental results pertaining to an embodiment of the present invention. The results depict the monitoring of a conditioning process by a plot of current flowing in the conductive region of a memory cell as a function of time, where both parameters were measured in arbitrary units. In the experiment, a memory cell 10 as shown in FIG. 1A, but without the hydrogen reservoir structure 2, was respectively subjected to no hydrogen as shown in graph A, water in gaseous form as shown in graph B and hydrogen gas as shown in graph C. The dielectric material of the resistive structure 1 was a transition-metal oxide in the experiment, specifically, chromium-doped strontium titanate. The gases were introduced in a vacuum chamber in which the memory cell 10 had been placed. An electrical field of $1.10^6$ V/m was applied between the electrodes M1, M2 so as to initiate the conditioning process.

As can be seen from graph A in FIG. 3, the magnitude of the current flow initiated in the conductive region by the application of a voltage between the electrodes M1, M2 is approximately 2E-7 and does not increase over the time range that the current is measured. This result depicts the conditioning process in previously-proposed devices. Specifically, the result shows that no conditioning process takes place in the measurement timeframe of the described-experiment in previously-proposed devices.

With reference being made to graph B in FIG. 3, it can be seen that by introducing water in gaseous form in the vicinity of the memory cell 10, the conditioning process was initiated at a higher magnitude of current, i.e. approximately 1E-5, than was the case in graph A. Furthermore, at a time measure of 20 arbitrary units, the magnitude of the current started increasing and reached a value of 1 by a time measurement of 700 arbitrary units.

With reference now being made to graph C in FIG. 3, it can be seen that by introducing hydrogen in the vicinity of the memory cell 10, the conditioning process was initiated at a higher magnitude of current, i.e. approximately 3E-4, than was the case for either of graphs A or B. Furthermore, and advantageously, the current had reached a value of 1 by a time measurement of 50 arbitrary units.

The results shown in FIG. 3 support the fact that the presence of hydrogen ions in the transition-metal oxide layer accelerates the conditioning process initiated therein. This formed the basis for introducing the hydrogen reservoir structure 2 in an embodiment of the present invention.

Figure 4:
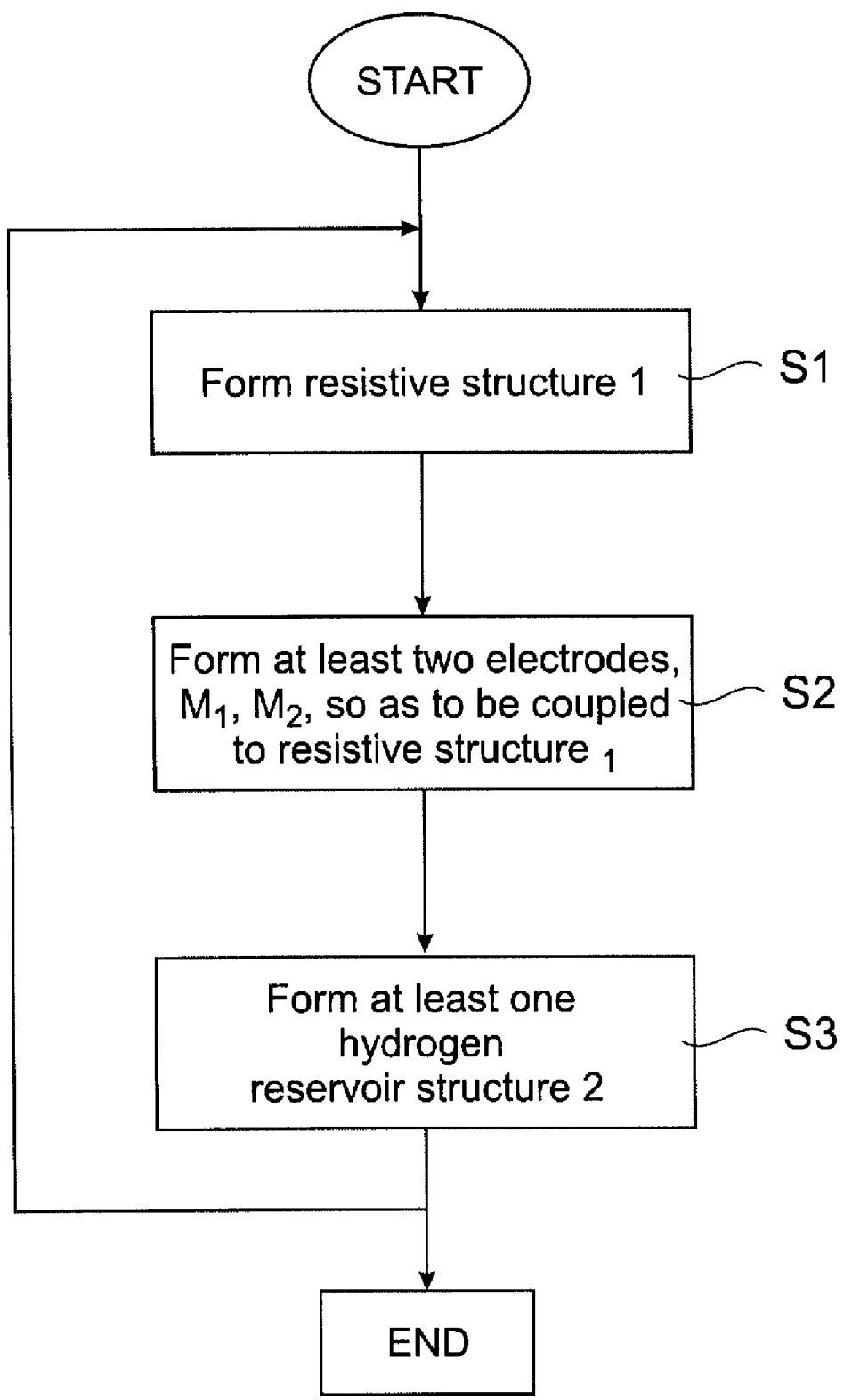

Reference is now made to FIG. 4, which schematically illustrates a method according to an embodiment of the present invention. A method according to an embodiment of the present invention is started by, in a step S1, forming a resistive structure 1. The material is of the resistive structure 1 is selected to be transition-metal oxide. In a step S2, at least two electrodes M1, M2 are formed so as to be coupled to the resistive structure 1. In a step S3, a hydrogen reservoir structure 2 is formed, marking the end of the process. A method according to an embodiment of the present invention is not limited to being performed once, i.e. after the completion of step S3, the process may loop back to the start of the method and steps S1 to S3 may be performed iteratively, thereby to produce multiple layers of memory cells according to an embodiment of the present invention. Any of the steps S1 to S3 can be performed in parallel or without maintaining a strict order of sequence. Any suitable technique known to a skilled person can be used for any one of steps S1 to S3. The method described with reference to FIG. 4 can be supplemented with further steps corresponding to features in a memory cell according to an embodiment of the present invention as described above.

Whilst an embodiment of the present invention has been described with reference to a stacked arrangement of the resistive structure 2 and the at least two electrodes, M1, M2, the present invention is not limited thereto and any suitable arrangement is taken to fall within the scope of the present invention, for example, where the resistive structure 2 and the electrodes M1, M2 are arranged parallel to the x-plane.

An embodiment of the present invention is advantageously applicable to materials with more than two persistent resistance states.

The present invention has been described above purely by way of example and modifications of detail can be made within the scope of the invention.

Each feature disclosed in the description and, where appropriate, the claims and drawings may be provided independently or in any appropriate combination.

The invention claimed is:

1. A memory cell comprising:
a resistive structure;
at least two electrodes coupled to opposite ends of the resistive structure, and
at least one hydrogen reservoir structure surrounding the resistive structure,
wherein the application of an electrical signal to one of the at least two electrodes causes the electrical resistance of the resistive structure to be modified by altering a hydrogen-ion concentration in the resistive structure.

2. A memory cell as claimed in claim 1, wherein at least one of the electrodes and/or the resistive structure is at least partially embedded in the hydrogen reservoir structure.

3. A memory cell as claimed in claim 1, wherein the hydrogen reservoir structure is provided integrally to at least one of the electrodes.

4. A memory cell as claimed in claim 1, wherein at least one of the electrodes is permeable to hydrogen.

5. A memory cell as claimed in claim 1, wherein at least one of the electrodes comprises a coupling layer for coupling the electrode to the resistive structure, the coupling layer comprising a material that absorbs at least 0.1 weight-percent of hydrogen.

6. A memory cell as claimed in claim 5, wherein the coupling layer comprises one of: palladium, iridium, rhodium, a hydride and an alloy comprising hydrogen.

7. A memory cell as claimed in claim 1, wherein the hydrogen reservoir structure comprises a first dielectric material.

8. A memory cell as claimed in claim 7, wherein the first dielectric material comprises one of: ozone tetraethoxysilane (TEOS), a transition-metal oxide, a metal hydroxide and a zeolite.

9. A memory cell as claimed in claim 1, wherein the resistive structure comprises a transition-metal oxide.

10. A non-volatile memory device comprising at least one memory cell, said memory cell comprising:
a resistive structure;
at least two electrodes coupled to opposite ends of the resistive structure, and
at least one hydrogen reservoir structure surrounding the resistive structure,
wherein the application of an electrical signal to one of the at least two electrodes causes the electrical resistance of the resistive structure to be modified by altering a hydrogen-ion concentration in the resistive structure.

11. A non-volatile memory device comprising at least two memory cells as claimed in claim 1, wherein the hydrogen reservoir structure is provided so as to be shared by the at least two memory cells.

12. A method for fabricating a memory cell comprising the steps of:
providing a resistive structure (S1);
coupling at least two electrodes to opposite ends of the resistive structure (S2), and
providing at least one hydrogen reservoir structure (S3) surrounding the resistive structure, wherein the application of an electrical signal to one of the at least two electrodes causes the electrical resistance of the resistive structure to be modified by altering a hydrogen-ion concentration in the resistive structure.

13. A method for fabricating a memory cell as claimed in claim 12 wherein, in the step of providing the at least one hydrogen reservoir structure, at least one of the electrodes and/or the resistive structure is at least partially embedded in the hydrogen reservoir structure.

14. A method for fabricating a memory cell as claimed in claim 12 wherein, in the step of providing the at least one hydrogen reservoir structure, the hydrogen reservoir structure is provided integrally to at least one of the electrodes.

15. A method for fabricating a memory cell as claimed in claim 12, wherein at least one of the electrodes is selected to be permeable to hydrogen.

16. A method for fabricating a memory cell as claimed in claim 12, wherein at least one of the electrodes comprises a coupling layer for coupling the electrode to the resistive structure, the coupling layer comprising a material that absorbs at least 0.1 weight-percent of hydrogen.

17. A method for fabricating a memory cell as claimed in claim 16, wherein the coupling layer is selected to comprise one of: palladium, iridium, rhodium, a hydride and an alloy comprising hydrogen.

18. A method for fabricating a memory cell as claimed in claim 12, wherein the hydrogen reservoir structure is selected to comprise a first dielectric material.

19. A method for fabricating a memory cell as claimed in claim 18, wherein the first dielectric material is selected to comprise one of: ozone tetraethoxysilane (TEOS), a transition-metal oxide, a metal hydroxide and a zeolite.

20. A method for fabricating a memory cell as claimed in claim 12, wherein the resistive structure is selected to comprise a transition-metal oxide.

* * * * *